(12) United States Patent
Weissenberger

(10) Patent No.: US 6,624,631 B2
(45) Date of Patent: Sep. 23, 2003

(54) OPERATING METHOD FOR A MAGNETIC RESONANCE TOMOGRAPHY APPARATUS

(75) Inventor: Volker Weissenberger, Moehrendorf (DE)

(73) Assignee: Siemens Aktiengesellschaft, Munich (DE)

(*) Notice: Subject to any disclaimer, the term of this patent is extended or adjusted under 35 U.S.C. 154(b) by 127 days.

(21) Appl. No.: 09/790,149

(22) Filed: Feb. 21, 2001

(65) Prior Publication Data

US 2001/0015645 A1 Aug. 23, 2001

(30) Foreign Application Priority Data

Feb. 22, 2000 (DE) .......................................... 100 08 051

(51) Int. Cl.$^7$ .......................... G01V 3/00; G01R 33/48; H03M 1/06
(52) U.S. Cl. ........................ 324/309; 324/303; 324/318; 341/118; 341/120
(58) Field of Search ................................ 324/318, 309, 324/322, 303; 341/157; 375/350

(56) References Cited

U.S. PATENT DOCUMENTS

| | | | | |
|---|---|---|---|---|
| 3,667,035 A | * | 5/1972 | Slichter | ...................... 324/303 |
| 4,320,523 A | * | 3/1982 | Horikawa et al. | .......... 375/350 |
| 5,424,735 A | * | 6/1995 | Arkas et al. | ................. 341/157 |
| 5,442,290 A | * | 8/1995 | Crooks | ........................ 324/309 |
| 5,529,068 A | * | 6/1996 | Hoenninger, III et al. | .. 600/413 |
| 6,025,720 A | | 2/2000 | Lenz et al. | .................. 324/322 |
| 6,208,279 B1 | * | 3/2001 | Oprescu | ...................... 341/143 |
| 6,285,304 B1 | * | 9/2001 | Schweighofer | ............. 341/118 |
| 2001/0015645 A1 | * | 8/2001 | Weissenberger | ............ 324/318 |

FOREIGN PATENT DOCUMENTS

DE   OS 198 37 440   2/2000

* cited by examiner

*Primary Examiner*—Diego Gutierrez
*Assistant Examiner*—Tiffany A. Fetzner
(74) *Attorney, Agent, or Firm*—Schiff Hardin & Waite

(57) ABSTRACT

In an operating method for a magnetic resonance tomography apparatus a sequence of digital signals is transmitted to the digital-analog converter. An analog signal is emitted from the digital-to-analog converter for each digital signal to a coil system for producing a gradient magnetic field. A signal processor produces a processed digital signal which is supplied to the digital-to-analog converter to produce the analog signal. A difference between the incoming digital signal and the processed digital signal Is determined by the signal processor and is added to the next incoming digital signal or at least for a portion thereof.

8 Claims, 3 Drawing Sheets

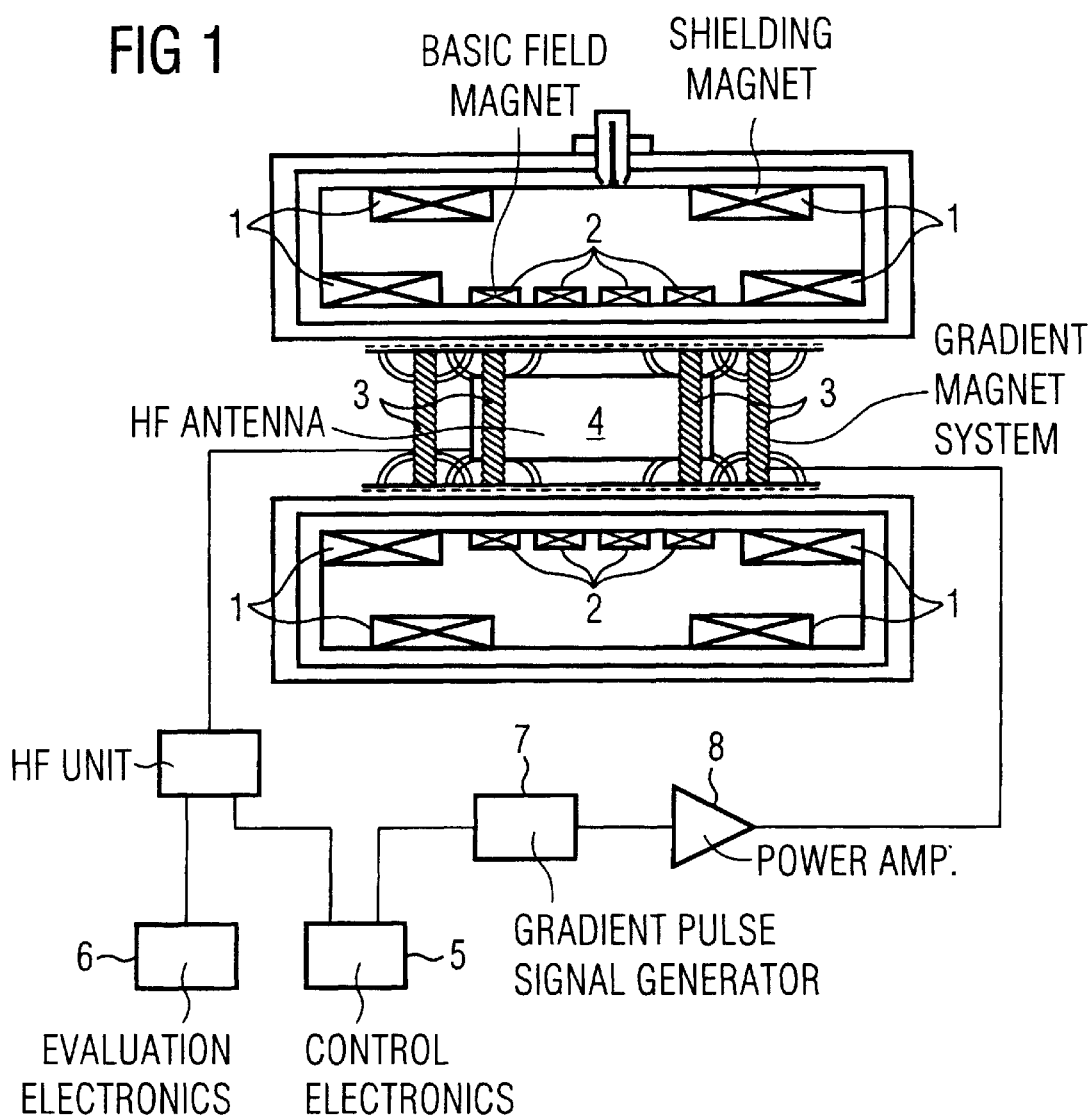
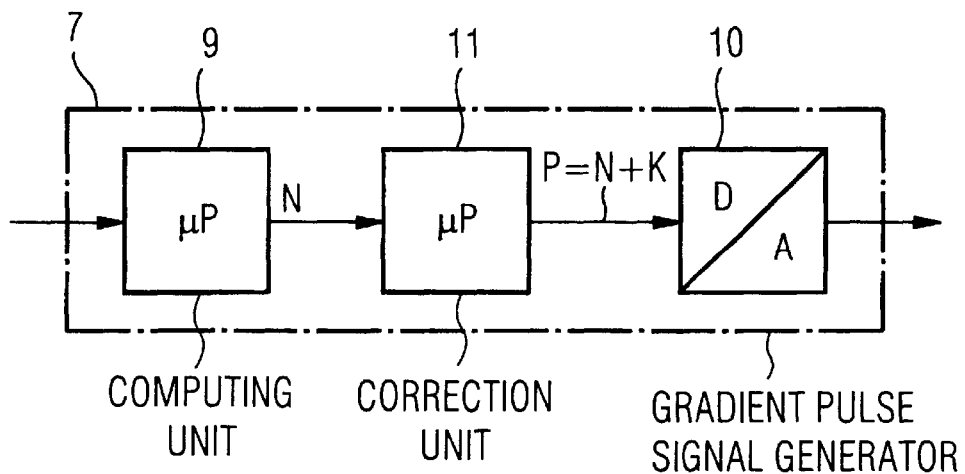

OPERATING METHOD FOR A MAGNETIC RESONANCE TOMOGRAPHY APPARATUS

BACKGROUND OF THE INVENTION

1. Field of the Invention

The present invention is directed to a method for operating a magnetic resonance tomography apparatus having a gradient magnet system, of the type wherein a sequence of digital signals are transmitted to a digital-to-analog converter and wherein the digital-to-analog converter, for each digital signal supplied thereto, generates a gradient current pulse which is supplied to a gradient coil to produce a gradient magnetic field in the magnetic resonance tomography apparatus,

2. Description of the Prior Art

In the context of the operation of digital-to-analog converters, it is generally known that a quantization error or quantization uncertainty is inherent in the conversion process. This is because the emitted analog signal, which is continuous, nevertheless can assume only discrete values as a result of the conversion process. Successive values of the analog signal can differ, at a minimum, by the step size of the amplitude increase (or decrease) associated with a bit of the incoming digital signal. Therefore, as long as the digital signal supplied to the digital-to-analog converter is within a bandwidth (range) of one-half of the minimum step size to the nearest analog signal which can be emitted, that analog signal will be emitted.

In the context of digital-to-analog converters which are used to produce gradient pulses in magnetic resonance tomography apparatus, the deviations between the "theoretical" analog signal to be emitted, and the analog signal which is actually emitted by the converter, particularly with respect to low signal levels, can produce errors which are not negligible in the subsequent image reconstruction.

SUMMARY OF THE INVENTION

It is an object of the present invention to provide a method for operating a magnetic resonance tomography apparatus wherein the aforementioned quantization error is reduced or substantially eliminated.

The above object is achieved in accordance with the principles of the present invention in a method for operating a magnetic resonance tomography apparatus having a digital-to-analog converter of the above type, wherein the analog signal emitted by the converter is converted into a digital signal and this digital signal is compared to the incoming digital signal which was used to produce the analog signal fin the converter. Any difference between these two digital signals which is identified as a result of the comparison is added to the next incoming digital signal which is to be converted.

As a result of the inventive method, the aforementioned quantization errors cannot accumulate overtime. The phase error of the magnetic resonance signal, which leads to errors in the image reconstruction, is dependent on the total error integrated (accumulated) over time. Since such accumulation cannot occur, such phase errors do not reach a level which can produce errors in the image reconstruction. The error feedback in accordance with the inventive method, therefore, minimizes or completely eliminates the quantization error, without the need for more complicated techniques, such as over-sampling or higher resolution digital-to-analog conversion.

The inventive method is particularly effective when some of the digital signals are in the order of magnitude of the minimum step size.

The method is preferably applied to rapidly operating digital-to-analog converters, such as when the sequence of digital signals is transmitted to the digital-to-analog converter, and the analog signal is emitted by the digital-to-analog converter, with a time clock of one millisecond at a maximum, preferably below 0.1 millisecond, for example, 0.01 millisecond.

Applying the inventive method only to small digital signals is particularly expedient when the sequence of digital signals is composed of a first sequence of digital signals and second sequence of digital signals, with the second sequence of digital signals being emitted following the first sequence of digital signals, and wherein the digital signals in the second sequence are significantly lower than the digital signals in the first sequence.

In the production of gradient pulses, it is normally the case that the digital signals of the first sequence are composed of nominal signals and compensation signals, and the digital signals in the second sequence are composed only of compensation signals. The nominal signals are used by the coil to generate a gradient magnetic field, and the compensation signals compensate for noise fields which the gradient magnetic field produces in components surrounding the gradient coils.

DESCRIPTION OF THE DRAWINGS

FIG. 1 is a schematic illustration of a portion of a magnetic resonance tomography apparatus, operating in accordance with the inventive method.

FIG. 2 is a block diagram of a gradient pulse generator constructed and operating in accordance with the principles of the present invention.

DESCRIPTION OF THE PREFERRED EMBODIMENTS

Figure 3:
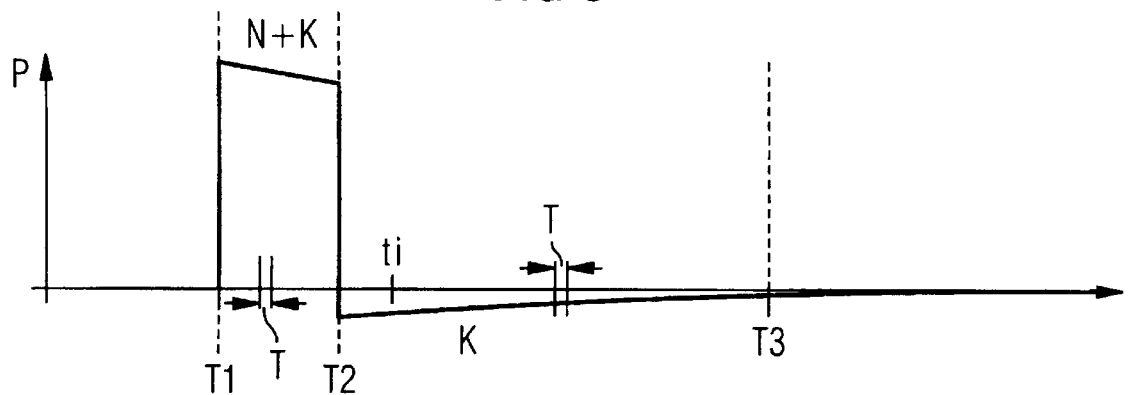
FIG. 3 shows an example of a gradient pulse generator by the gradient pulse generator of FIG. 2.

As shown in FIG. 1, a magnetic resonance tomography apparatus has a shielding magnet 1. The shielding magnet 1 is superconducting and serves the purpose of shielding outer magnetic fields. The magnetic resonance tomography apparatus also has a basic magnet 2. The basic magnet 2 is also superconducting and serves the purpose of generating a basic (static) magnetic field. Furthermore, the magnetic resonance tomography apparatus has a gradient magnet system 3 having at least one gradient coil by means of which a gradient field pulse can be superimposed on the basic magnetic field The magnetic resonance tomography apparatus has a high-frequency antenna 4. Depending on the drive thereof by an HF unit 12, the high-frequency antenna 4 can act as high-frequency magnetic field generator (emitter) or as a high-frequency magnetic field detector (receiver). The high-frequency antenna 4 is driven via control electronics 5, so that it alternately generates and receives a high-frequency magnetic field received high-frequency magnetic field signals are supplied to evaluation electronics 6, wherein the signals are evaluated and edited.

The control electronics 5, among other things, also drives a gradient pulse signal generator 7. The signal generator 7 generates an electrical pulse signal P, which is supplied to the gradient magnet system 3 via a highly accurate power amplifier 8, which in turn drives a coil of the gradient magnet system to emit the aforementioned gradient pulse.

In order to be able to properly carry out an evaluation of the received high-frequency field, the gradient signal pulse P must be highly accurate. As shown in FIG. 2, a digital computing unit 9 therefore calculates a nominal pulse N within the gradient pulse generator 7. The nominal pulse N is composed of a sequence of highly accurate nominal signals N(ti). If the nominal signals N(ti) were to be directly supplied to the power amplifier 8 via the digital-to-analog converter 10, the gradient coil system 3, considered in and of itself, would exactly generate a desired gradient magnetic field. The gradient field, however, causes noise fields in components surrounding the gradient coil system 3. These noise fields are caused in the other inductive components 1, 2, 4, in particular. The noise fields are considerably lower than the nominal pulse N. However, they are still disturbing, since the generated gradient field is to be highly accurate.

Noise fields that will be caused by a gradient pulse P can be calculated in advance. Therefore, it can also be calculated in advance how the nominal pulse N must be corrected, so that the desired gradient field can be generated despite the noise fields in the result. The nominal pulse N therefore is supplied to the digital-to-analog converter 10 via a correction unit 11, which determines a compensation pulse K on the basis of the nominal pulse N and which transmits the sum of the nominal pulse N and the compensation pulse K, as the gradient pulse signal P, to the digital-to-analog converter 10. Therefore, the compensation pulse K, and the gradient pulse P, are also composed of a sequence of compensation signals K(ti) or, respectively, gradient signals P(ti).

Figure 4:
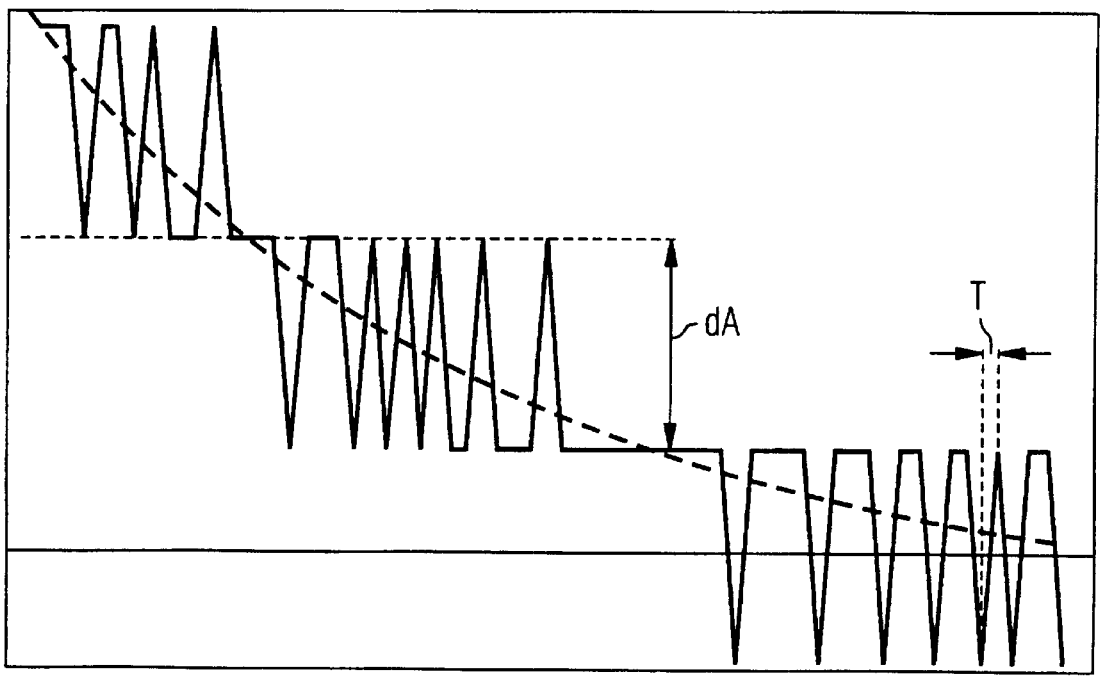
FIG. 4 shows a portion of the gradient pulse of FIG. 3.

FIG. 3 shows a typical example of a gradient pulse signal P. As shown in FIG. 3, the nominal pulse N exhibits values that are different from zero during a first phase lasting from a time T1 until a time T2. The digital signals P(ti) that are present as the sum of nominal signals N(ti) and compensation signals K(ti) assume large values during this period of time. The nominal value N exhibits the value zero during a second phase lasting from a time T2 to a time T3. The compensation pulse K slowly drops exponentially down to zero. The now occurring digital signals P(ti) therefore are considerably lower than before. As can be seen from FIG. 4, the values of the compensation pulse K are even situated in the order of magnitude of a minimum step size dA of the digital-to-analog converter during the second phase, namely between the times T2 and T3.

The digital-to-analog converter 10 is operated with a time clock T. The sequence of digital signals P(ti) is successively transmitted to the digital-to-analog converter 10. Data are transmitted per time clock T. The digital-to-analog converter 10 emits an analog signal A(ti) per transmitted digital signal P(ti). The overall transmitted digital signals P(ti) form the gradient signal pulse P, which is to be emitted as a gradient magnetic field by the gradient coil system 3. The time clock T should be as small as possible. It should be one millisecond at a maximum. As shown in the exemplary embodiment, it is even below 0.1 millisecond, namely 0.01 millisecond.

Figure 5:
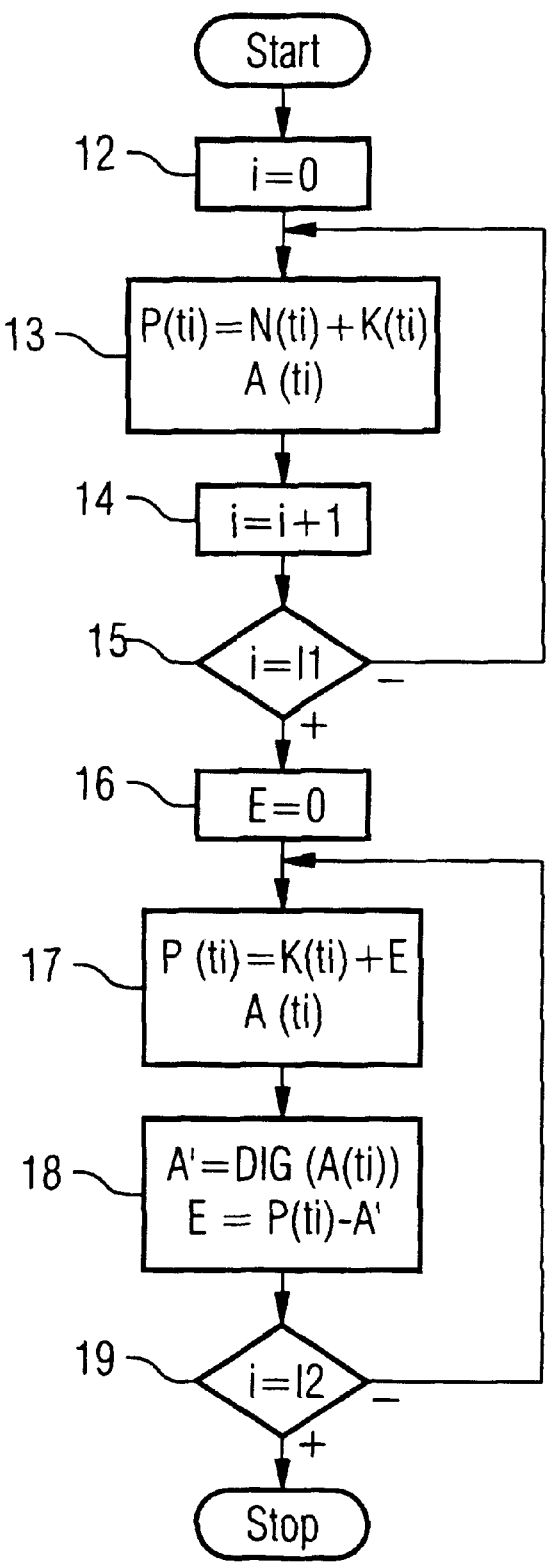
FIG. 5 is a flow chart for the generation of an analog signal in accordance with the inventive method.

An analog signal is determined in accordance with the invention as shown in the flow diagram of FIG. 5.

In a step 12, a running parameter i is initially set to the value zero. In a step 13, a nominal signal N(ti) is determined, and an analog signal A(ti) is determined from the nominal signal N(ti). In a step 14, the running parameter i is incremented. In a step 15 it is checked whether the running parameter i has reached a nominal number 11. If it has not yet reached the nominal number 11, a branch is made to step 13. Otherwise, the procedure continues with step 16.

In step 16, a sum error E is set to the value zero. In a step 17, the digital signal P(ti) to be emitted is determined as the sum of the compensation signal K(ti) and the sum error E. The nominal signal N(ti) now has the value zero. Furthermore, the corresponding analog signal A(ti) is determined on the basis of the digital signal P(ti). In a step 18, an output signal A' is determined. The output signal A' is the digitized value of the emitted analog signal A(ti). This output signal A' is subtracted from the digital signal P(ti) and the result is allocated to the sum error E. In a step 19, it is checked whether the running parameter I has reached a total number I2. If not, a branch is made to step 17. Otherwise implementation of the method and therefore the output of the digital signals P(ti) is completed.

As shown in FIG. 5, the inventive correction of the digital signals P(ti) to be emitted is only carried out when the nominal pulse N is completed. Although the digital signals P(ti) are situated in the order of magnitude of the minimum step size dA in this case, it also would be possible to always carry out the inventive error correction.

The inventive method is particularly suitable for use in generating the gradient pulse signal P, which is to be supplied to the gradient coil system 3, since the gradient pulse signal P causes a phase error in the received high-frequency magnetic field, this phase error being proportional to the chronological integral of the deviation of the actually present gradient field from an ideal field. As a result of the inventive method, the error caused by the quantization can be clearly reduced, or can be practically completely eliminated, depending on the time clock T.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance tomography apparatus having a gradient coil system, which emits a gradient magnetic field in response to a gradient pulse signal supplied thereto, and a gradient purse generator, which generates said gradient pulse signal, including a digital-to-analog converter exhibiting a quantization error and a signal processor unit, said method comprising the steps of;

(a) supplying an incoming digital signal to said signal processing unit;

(b) processing said incoming digital signal in said signal processing unit to obtain a processed digital signal;

(c) converting said processed digital signal of step (b) into an analog output signal in said digital-to-analog converter;

(d) digitizing said analog output signal of step (c) to obtain a digitized analog signal, as well as emitting said analog output signal from step (c) from said digital-to-analog converter as said gradient pulse signal;

(e) identifying a difference, if any, between said incoming digital signal of step (a) and said processed digitized analog signal of step (b); and (f) supplying a next incoming digital signal to said signal processing unit and processing said next incoming digital signal in said signal processing unit, including adding said difference from step (e) to said next incoming digital signal to prevent accumulation of said quantization error in said next incoming digital signal.

2. A method as claimed in claim 1 wherein any two signals emitted by said digital-to-analog converter, if not equal to each other, differ at least by a minimum step size for converting said processed digital signal to said analog output signal, and wherein said incoming digital signal and said next incoming digital signal respectively have components within an order of magnitude of said minimum step size and components outside of said order of magnitude of said minimum step size.

3. A method as claimed in claim 1
wherein the incoming digital signals form a sequence having a first and a second sequence part;
wherein the first sequence part comprises a last incoming digital signal which is processed after all other incoming digital signals of the first sequence part;
wherein the second sequence part comprises a first incoming digital signal which is processed before all other incoming digital signals of the second sequence part;
wherein the first incoming digital signal of the second sequence part is the next incoming digital signal with respect to the last incoming digital signal of the first sequence part;
wherein the incoming digital signals of the first sequence part have values above a first threshold;
wherein the incoming digital signals of the second sequence part have values below a second threshold; and
wherein the second threshold is substantially lower than the first threshold.

4. A method as claimed in claim 1 wherein the step of supplying said incoming digital signal to said signal processing unit comprises supplying an incoming digital signal with time clock of a maximum of 1 millisecond to said digital-to-analog converter.

5. A method as claimed in claim 4 comprising supplying said incoming digital signal to said signal processing unit with a time clock below 0.1 millisecond.

6. A method as claimed in claim 5 comprising supplying an incoming digital signal to said signal processing unit with a time clock of 0.01 millisecond.

7. A method as claimed in claim 3 comprising:
supplying nominal signals and compensation signals to said digital-to-analog converter as said first sequence part;
supplying digital signals composed only of compensation signals to said digital-to-analog converter as said second sequence part;
employing said nominal signals to generate a gradient magnetic field with said gradient coil; and
employing said compensation signals to generate compensating fields for compensating for noise fields produced by said gradient magnetic field in components surrounding said gradient coil system.

8. A magnetic resonance tomography apparatus comprising:
a gradient coil system which emits a gradient magnetic field dependent on a gradient pulse signal supplied thereto;
a gradient pulse signal generator, connected to said gradient coil system, which generates said gradient pulse signal, said gradient pulse signal generator including a signal processing unit and a digital-to-analog converter exhibiting a quantization error, said signal processing unit being supplied with an incoming digital signal for converting said incoming digital signal into a processed digital signal which is supplied to said digital-to-analog converter for producing an analog output signal as said gradient pulse signal; and
said signal processing unit also including an analog-to-digital converter for converting said analog output signal Into a digitized analog signal, and said signal processing unit identifying a difference between said processed digital signal and said incoming digital signal and adding said difference to a next incoming digital signal to prevent accumulation of said quantization error in said next incoming digital signal.

* * * * *